United States Patent [19]

Jacob et al.

[11] 4,144,116

[45] Mar. 13, 1979

[54] VAPOR DEPOSITION OF SINGLE CRYSTAL GALLIUM NITRIDE

[75] Inventors: Guy M. Jacob, Creteil; Jean P. Hallais, Ablon, both of France

[73] Assignee: U.S. Philips Corporation, New York, N.Y.

[21] Appl. No.: 667,690

[22] Filed: Mar. 17, 1976

[30] Foreign Application Priority Data

Mar. 19, 1975 [FR] France ............................... 75 08612
Mar. 19, 1975 [FR] France ............................... 75 08613
Mar. 19, 1975 [FR] France ............................... 75 08615

[51] Int. Cl.² .................... B01J 17/32; C01B 21/06; C01G 15/00
[52] U.S. Cl. .................................. 156/611; 156/614; 156/DIG. 99; 156/605; 423/409; 148/175; 252/62.3 GA; 427/85
[58] Field of Search ............... 156/610, 611, 612, 613, 156/614, 605, 606, DIG. 70; 148/175, 176; 252/62.3 GA; 423/409, 111; 427/85, 87

[56] References Cited

U.S. PATENT DOCUMENTS

| | | |
|---|---|---|
| 3,178,313 | 4/1965 | Moest .................................. 156/610 |
| 3,511,702 | 5/1970 | Jackson, Jr. et al. ................ 156/612 |
| 3,829,556 | 8/1974 | Logan et al. ......................... 423/409 |
| 3,888,705 | 6/1975 | Fletcher et al. ......... 252/62.3 GA X |
| 3,901,746 | 8/1975 | Boucher ........................... 156/606 X |
| 3,922,475 | 11/1975 | Manasevit ........................ 156/612 X |
| 3,925,119 | 12/1975 | Philbrick et al. ................ 156/610 X |

OTHER PUBLICATIONS

Ban, "Mass Spectrometric Studies of Vapor-Chase Crystal Growth", J. Electrochem. Soc. vol. 119, No. 6, pp. 761–765 (Jun. 1972).

Shintani et al., "Kinetics of the Epitaxial Growth of GaN Using Ga, HCl, and NH₃", J. Crystal Growth, 22 (1974), 1–5.

Maruska et al., "The Preparation & Properties of Vapor-Deposited Single-Crystalline GaN", Applied Physics Letters, vol. 15, No. 10, pp. 327–329, Nov. 15, 1969.

*Primary Examiner*—S. J. Emery
*Attorney, Agent, or Firm*—Norman N. Spain

[57] ABSTRACT

Method of manufacturing gallium nitride crystals by reaction of galium halide and ammonia in which free hydrogen chloride is introduced into the reaction and deposition zones.

42 Claims, 3 Drawing Figures

VAPOR DEPOSITION OF SINGLE CRYSTAL GALLIUM NITRIDE

The present invention relates to a method of manufacturing single crystals constituted mainly by gallium nitride by crystal growth from the vapour phase, the said growth being carried out during a synthesis of gallium nitride obtained in an open reactor, by reaction of a gallium halide with ammonia diluted with in a carrier gas in an open reactor gas.

The present invention also relates to the single crystals obtained by said method and electroluminescent devices manufactured with said material.

Due to its large forbidden bandwidth, gallium nitride is of interest as a light source including a blue light which is particularly agreeable to the eye.

For the same reasons in the crystals of which the lattices are analoguous to those of gallium nitride and in which, in certain places, the gallium atoms are replaced by indium atoms or aluminum atoms, as well are also of interest as lattices comprising so-called doping impurities.

It is known that the luminous efficiency of a semiconductor crystal depends closely on its crystal quality, i.e. inter alia on the regularity of the lattice, on the parallelism of the homologue planes and on the absence of crystal boundaries. In fact, the crystal defects which constitute non-radiated recombination centers are harmful for a good luminous efficiency. It is therefore endeavoured to reduce the number of these crystal defects as much as possible.

It is also known that it is impossible at the moment to obtain monocrystalline gallium nitride other than by epitaxial methods.

It may relate to heteroepitaxy, i.e. epitaxy on monocrystalline substrates of different bodies of which the crystal lattice makes the operation possible: gallium nitride which crystallizes in the hexagonal system may be deposited on corundum which is also hexagonal and on spinels of which the lattice is cubic, notably on bodies of the formula $Al_2O_3.MgO$.

It may relate to homoepitaxy, i.e. epitaxy on a monocrystalline layer of gallium nitride which, in the actual state of technology, can only have been obtained starting from a heteroepitaxial deposit.

Usually, and this is the case notably with gallium nitride, the creation of homoepitaxial layers differs from that of heteroepitaxial layers only in the establishment of the first layers, termed nucleation, which in the case of heteroepitaxy, where they are called heteronucleation layers, necessitate special precautions, the growth of the following layers on layers already provided on the deposited body presenting, in the two cases, a large number of analogies and being usually identical.

The present invention relates precisely to said crystal growth for which up till now a large number of difficulties are encountered.

For example, the resulting layers are generally irregular; with poor flatness which is a big handicap for any technology; and parallellism of the planes of the lattice is bad and the crystal boundaries are numerous; the material obtained is strongly doped n-type and contains even gallium inclusions certain of which are in the form of balls and all of which disturb the lattice. Electroluminescence tests show the absence of homogeneity of the material by showing punctual luminous centres.

Moreover, the area of the resulting monocrystalline layers seldom exceeds a square centimeter.

It is known that the method of synthesis of gallium nitride most generally employed consists in reacting, at a temperature between 820° C. and 1100° C., gaseous gallium chloride and ammonia which is supplied by means of a carrier gas, for example hydrogen, helium, argon or nitrogen, and the deposit is effected on a suitable substrate, for example corrumdum, or on a spinel.

During the reaction there is formed, besides gallium nitride which deposits immediately, hydrogen chloride acid while in addition hydrogen is liberated. These two gases are carried along by the carrier gas. The gallium chloride used is frequently manufactured inside the synthesis reactor by reaction on liquid gallium by a hydrogen chloride gas flow, as described, for example, in the article by M. ILEGEMS published in "Journal of Crystal Growth" 13/14 (1972) pp. 360-364.

Applicants who have carried out numerous experiments on the growth of monocrystal lattices constituted mainly by gallium nitride, have endeavoured to predict the conditions in which a good crystal quality could be obtained during the growth. They have found notably that it is always important and often essential to introduce in the reaction zone and deposition zone a considerable quantity of free hydrogen chloride notably at high temperature.

According to the invention, a method of manufacturing single crystals constituted mainly by gallium nitride by crystal growth from the vapour phase, the said growth being carried out during a synthesis of gallium nitride obtained by reaction of a gallium halide with ammonia immersed in a carrier gas in an open reactor, is characterized in that, during at least a part of the said growth, free hydrogen chloride gas under a partial pressure of 2-50% of the total pressure is brought into the reaction zone and the deposition zone.

If desired, said addition of free hydrogen chloride gas may be made only during the heteronucleation phase, only during a homoepitaxial growth or advantageously during the whole duration of the formation of the single crystal.

The advantages of said method are numerous. It allows the of obtaining plane regular layers which are useful in technology.

The crystal lattice is regular, the planes being parallel without crystal boundaries and inclusions of gallium, the material is fully doped the electroluminescence obtained is homogeneous.

In the blue spectrum said layers present external quantum efficiencies between 1 and 10% at ambient temperature, which is quite remarkable, and, while avoiding turbulences, the area of the layers thus obtained by Applicants has been 30 $cm^2$, whereas by using the prior art, layers of a quite inferior quality have been obtained having only an area of at most equal to 1 $cm^2$.

If said growth is effected on a heteronucleation layer connected to a given substrate, for example of corrundum, or a spinel, the deposited thickness is limited by the mechanical and thermal stresses, for example to 200 $\mu m$ due to the fracture of the substrate. If said growth is carried out on a substrate of gallium nitride, for example on a thick layer obtained by heteronucleation and epitaxy, and is then separated from its substrate by sawing or by any other method, the thickness of the monocrystalline layer thus formed may be much higher.

Without limiting the present invention to only the following explanation, it seems that the hydrogen chloride gas under a strong partial pressure supresses the tendency of gallium nitride to decompose or not to form and to leave in the lattice nitrogen vacancies or even gallium balls. The hydrogen chloride gas, when it is deposited, attacks said free gallium which, passing to the gaseous state, is evacuated by the carrier gas. In any case, the resulting layers, in the absence of added dopants, are weakly of n-type and without gallium inclusions. It is known that the prior art crystals were strongly doped no doubt by nitrogen vacancies; the gallium nitride actually has a strong tendency of decomposing and a reluctance to form.

Advantageously, the said gallium halide is gallium chloride of which the partial pressure is lower than five hundredths of the overall pressure, while the partial pressure of ammonia is higher than fifteen hundredths of the said overall pressure, a strong supersaturation of ammonia being favourable.

The deposition rate depends on the pressure of gallium chloride. In the case of the growth and homoepitaxy it may be very rapid, for example 100 μm to 200 μm/hour.

The method according to the present invention applies to the deposits in which one or the other of the atoms of the lattice is replaced in certain points by helium atoms, indium atoms or aluminum atoms, introduced for example, in the form of halides and notably indium chloride, or atoms of such doping bodies as: zinc, cadmium, magnesium, lithium, beryllium, which can notably be introduced into the reactor in the form of halides, in particular chlorides, or in the form of metal vapours.

Applicants have obtained notably by said method zinc-doped insulating gallium nitride of high quality, by introducing the zinc in the form of metal vapours.

If the method is carried out under a pressure near atmospheric pressure, for example in an open system in a temperature range between 720° and 1100° C., the partial pressure of ammonia, with the use of a carrier gas other than hydrogen, must be higher than 0.150 atmosphere, the partial pressure of gallium chloride must be lower than 0.5 atmosphere and the partial pressure of hydrogen chloride must be between 0.02 atmosphere and 0.4 atmosphere, but advantageously a partial ammonia pressure between 0,3 and 0.6 atmosphere, a partial pressure of hydrogen chloride between 0.05 and 0.2 atmosphere and a temperature between 900° C. and 950° C. is chosen.

The method according to the invention may be combined with the known method according to which gallium chloride is manufactured in situ in the reactor by a flow of hydrogen chloride reacting on liquid gallium. However, it is necessary to ensure that the hydrogen chloride of which the presence is desired in the reaction zone and deposition zone cannot combine with the liquid gallium. Experience has proved to Applicants that, due to the high reactivity of hydrogen chloride for the gallium, it is important for this purpose to create gallium chloride in a depressed portion of the reactor and comprising its own supply of hydrogen chloride, separated from the hydrogen chloride supplied according to the invention.

This supply of hydrogen chloride may open directly into the reaction zone and deposition zone; the HCl flow according to the invention may also be combined with the flow of gallium chloride or with that of the carrier gas or that of ammonia. In any case it should be ensured that the mixture of NHl and $NH_3$ is made at a temperature above 250° C. so as to avoid the precipitation of ammonium chloride.

It is to be noted that in the prior art method the flow of gallium chloride manufactured in situ by reaction of hydrogen chloride on molten gallium comprises only substantially little free hydrogen chloride. In the above-mentioned article, the author, M.ILEGEMS, states that the reaction of hydrochloric acid on gallium is practically complete and Vladimir S.BAN, in an article published in the "Journal of the Electrochemical Society" June 1972, pp. 761–765, gives measured results according to which at least four fifths of hydrogen chloride introduced on the gallium was converted into gallium chloride. The quantity of residual hydrogen chloride gas present in the reaction and deposition zone was thus small and quite inefficient, experience having proved to Applicants that a strong partial pressure of said gas was necessary.

Advantageously, the carrier gas is free of hydrogen. An inert gas, for example argon, may be used or even nitrogen or ammonia, a strong partial pressure of ammonia presenting not many difficulties. In fact, the hydrogen seems to favour the decomposition of the gallium nitride, particularly at high temperature.

It is to be noted in addition that in order to suppress the mechanical stresses resulting from the growth of single crystals of gallium nitride on substrates of different natures, it is necessary to reheat said single crystals. The reheating is carried out at a temperature of 88° C. (600°–1000° C.). Due to the harmfulness of hydrogen, which produces the appearance of gallium balls in the monocrystal lattice, the atmosphere of reheating must be absolutely free from said gas; for example, nitrogen is used.

Advantageously the production turbulences are in the deposition zone is avoided by using a reactor having an elongate shape which is swept by an atmosphere comprising at least a carrier gas in which the ammonia and at least the greater part of the carrier gas are introduced in the proximity of a first extremity upstream of the said reactor, creating an atmosphere which flows along the said reactor towards the second extremity downstream of that in the proximity of which residual gases are evacuated, in that the gas flow comprising gallium halide is given a direction parallel to that of the flow of the said atmosphere, and in that the said flow is introduced into a reactor and that it is guided up to the deposition zone by a separate route exiting in the deposition zone and in that the rate of flow of the said gas flow is between half and five time that of the rate of flow of the said atmosphere.

This method avoids the retrodiffusions which notably show important deposits of useless gallium nitride upstream of the inlet or the inlets of the gas. It also avoids the variation of the partial pressure of the various components which have a fundamental influence in the spreading of the results.

Applicants have in fact observed that in certain extreme conditions, comprising notably a strong partial pressure of gallium chloride and a weak ammonia pressure, there was formation of well crystallized large grains which did not have the orientation of the substrate, which hence do not cooperate in creating a monocrystalline other complex extreme conditions there was formation of small oriented grains which, if the deposition was continued up to an already high thickness of 10–20 μm, join together again, constituting an undulating monocrystalline layer of irregular thickness of which the grains were separated by joints charged with impurities, notably free gallium. Finally Applicants have established that in certain conditions a continuous layer appeared and that, in very precise conditions, said layer was monocrystalline, regular and plane.

Preferably, the said rate of flow of the said of halide is between the flow rate of flow of the atmosphere and the double of same.

Advantageously, the opening of the said separate route through which the gallium halide current is introduced, is situated in the flow of the said atmosphere upstream of the said substrate and preferably the said aperture is situated substantially at the level of the extremity upstream of the said substrate.

The of free hydrogen chloride is preferably introduced upstream of the reactor and mixed with the carrier gas and the ammonia. It being ensured that the temperature of the ammonia and the hydrochloric acid during the mixing and during the flow thereof should be higher than the formation temperature of ammonium chloride — 250° C. for a pressure of one atmosphere — so as to avoid the precipitation of same.

Said dissipation of the fluxes according to the present invention is applicable to open reactors under all pressures and notably to devices operating at atmospheric pressure.

The present invention presents very great advantages. Actually, in the production of gallium nitride, the required strong partial pressures, so the strong supplies, are first that of the carrier gas and also that of ammonia, since a strong supersaturation is favourable and even necessary for a good result. By admitting the ammonia and at least the greater part of the carrier gas upstream, a regular flow of said gases is obtained; by adding to said flux a current of the same direction and nearly the same rate, a good gas mixture without turbulence is ensured. Said method has permitted of obtaining excellent results, to be described in detail hereinafter.

Advantageously, carrier gas is added to the said halide flow at the low partial pressures of gallium halide in such manner as to obtain the suitable flow rate. Hence, the aperture of the inlet tube of the said halide flow may have a large dimension.

In addition, as mentioned below, it is necessary, to achieve good nucleation, to employ at that very instant of a partial pressure of gallium halide which is lower than 0.005 atmosphere — Applicants using themselves gallium chloride under a partial pressure of the order of 0.001 atmosphere — and it is even useful, for having a favourable yield of manufacture, to dispose then of a very much higher partial pressure of gallium halide, which may be up to 0.05 atmosphere, i.e. 50 times as high. Also, when the double regulation of the supply of gallium halide, which ensures the partial pressure and that of the flow rate, is effected by the regulation of carrier gas supply in said flow, which permits of using the same equipment, the augmentation of the supply of the carrier gas augments the said rate.

As already said above, the obtaining single crystals constituted mainly of gallium nitride implies possibly the introduction of other gases: gaseous compounds of bodies of which the atoms serve as a substitute, in one place or the other, for the nitrogen atoms or gallium atoms, or vapours of said bodies.

Said gaseous elements are always under a low partial pressure; therefore, their mode of introduction does not result in disturbing the flows of the other gases. In order to favour their distribution, they may advantageously either by introduced in the part upstream of the reactor, possibly through the inlet of the carrier gas and/or that of ammonia, or jointly with the flow of gallium halide and through the inlet of same.

The dopants are preferably introduced upstream of the reactor. Applicants have notably obtained excellent results by thus introducing zinc vapours.

Preferably, the bodies introduced in the form of halide, notably indium and aluminum, are added to the gallium halide flow. In the modified embodiment according to which gallium halide is a gallium chloride created in situ in the reactor by the passage of a hydrogen chloride flow on liquid gallium in a bulge present in the reactor and comprising its own inlet of hydrogen chloride, said bulge being separated from the hydrogen chloride supplied according to the invention, and having preferably an oblong shape and having hydrogen chloride introduced at an upper extremity while the gallium chloride is collected at the lower extremity.

Applicants have notably observed that the monocrystallinity was particularly difficult to establish during the phase of heteronucleation, during which were met notably the two defects mentioned above of large grains having an orientation independent of that of the substrate and small separated grains causing an undulation of the layer.

Applicants have also established that in fact the greater part of the defects arises during the deposition of the first heteroepitaxial layers on the substrate, during said initial heteronucleation phase, and that it is principally during said phase that it is important to combine a certain number of conditions; once the nucleation layers were established, the crystal growth continued easily enough.

Advantageously, a heteronucleation layer is deposited on a suitable substrate in the following conditions: the partial pressure of the gallium halide is lower than five thousandths of the total pressure, the partial ammonia pressure is higher than a tenth of the total pressure, the carrier gas is entirely free of hydrogen, free hydrogen chloride with a partial pressure between 2 and 50% of the total pressure is introduced in the reaction and deposition zone.

Advantageously, the said gallium halide is gallium chloride of which the partial pressure is advantageously lower than two thousandths of the total pressure, while the partial ammonia pressure is advantageously higher than fifteen hundredths of the total pressure, a strong supersaturation of ammonia being favourable, and the partial pressure of hydrochloric acid is between 50 and 120 times the partial pressure of gallium chloride.

If the method is carried out under a pressure near that of atmospheric pressure, for example in an open system, in a temperature range between 720° C. and 1100° C. (or better between 850° C. and 1100° C.), the partial pressure of gallium chloride must be lower than 0.005, or better, lower than 0.002 atmosphere, the partial ammonia pressure must be higher than 0.15, or better, higher than 0.20 atmosphere, and the partial pressure of hydrochloric acid must be between 0.02 and 0.4 atmosphere. Advantageously, a partial pressure of ammonia is chosen between 0.3 and 0.6 atmospheres, a partial pressure of hydrochloric acid between 0.05 and 0.2 atmosphere, and a temperature between 900° C. and 950° C. The layer is easily monocrystalline up to 750° C., but at low temperatures detachment is risked, while the high temperatures favour the creation of lattice defects, perhaps by the augmentation of the number of nitrogen vacancies.

The present invention presents numerous advantages. It results in obtaining an excellent nucleation which develops slowly, at a rate lower than 15 μm/hour, and simultaneously on the whole surface of the substrate.

A continuous layer obtained by said method is well constituted and plane, often starting from a thickness of 0.1 μm. It may be considered that the nucleation layer is created as soon as the substrate is no longer visible.

This permits of disposing very thin, regular, flat layers, which was impossible by the prior art method in which the grains grew in thickness before rejoining while forming an undulating system. Said layers are of a high quality, regular and without defective crystal boundaries, the parallellism of the reticular planes being excellent.

Starting from said nucleation layers, said thick regular layers of a very high quality may be deposited by simply modifying in the reactor the supplies of the various gases by increasing notably the supply of gallium halide (for example of the gallium chloride) up to a value lower than five hundredths of the total pressure so as to correlatively increase the deposition rate. Advantageously, the nucleation layer is given a thickness higher than 0.5 μm and preferably equal to or higher than 1 μm, for example, of the order of 2 μm.

The performance of the method according to the present invention results in obtaining layers of a high quality of which the material is little doped and the electroluminescence of which is homogeneous.

It is to be noted that the dopants, and notably zinc, may be introduced at the very beginning of the nucleation, or on the contrary later, and, if desired, in a progressive manner by augmenting the quantity of introduced dopant.

The gallium nitride crystallizing in the hexagonal system with a side of 3.18 Å length may be deposited on a hexagonal crystal of which the mesh has a length with a side facet of between 2.70 and 3.66 Å, as well as on the lattices of which the facet side lengths have dimensions of values nearly double or triple this size. It may notably be deposited on corrundum, notably on the 0001, 0110 and 0112 faces of the crystal lattice where excellent results are obtained.

The gallium nitride may also be deposited on spinels crystallizing in the cubic system. Applicants have notably obtained excellent monocrystalline layers of a very high quality, oriented 0001, by depositing on the 111 face single crystals of a body of the formula $Al_2O_3$, MgO.

The invention will now be described in greater detail, by way of example, with reference to the accompanying drawing, in which FIG. 1 is a sectional view of a plate obtained with a heteronucleation layer according to the invention.

As a substrate is chosen, for example, a plate 1 (or several plates) of corrundum (see FIG. 1), orientation 0001, thickness between 200 μm and 1 mm, for example 600 μm, width 20 mm, length 20 mm, which is subjected to a degreasing with caustic soda or potash succeeded by rinsing with deionized water, then with methyl or ethyl alcohol.

Figure 2:
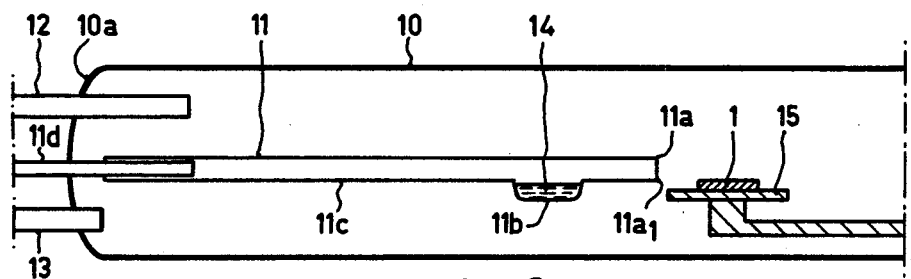
FIG. 2 shows diagrammatically part of the reactor for the synthesis of gallium nitride.

This substrate is placed in a reactor 10 of the horizontal type operating at a pressure near atmospheric pressure, of which reactor only the up stream is shown in FIG. 2; the lower part through which the spent gases flow comprises only an evacuation system.

Figure 1:
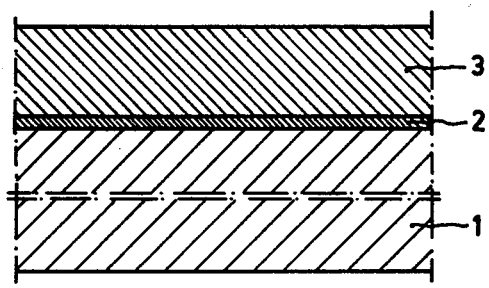
Figure 3:
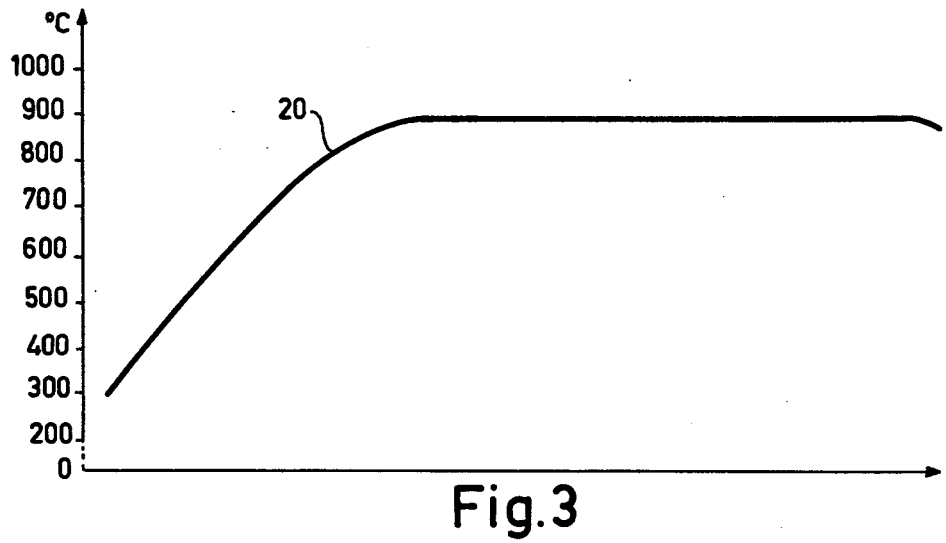
FIG. 3 is a graph indicating the level of the temperatures in each of the zones of the reactor shown in FIG. 2.

The reactor 10 is inserted in a furnace not shown in FIG. 2 but the temperature curve 20 of which is drawn in the graph of FIG. 3 in agreement with FIG. 1 (the temperature is plotted on the ordinate in degrees centigrades).

Reference numeral 11 in FIG. 2 denotes the inlet tube for the gallium chloride and 12 and 13 denote two other gas inlet tubes situated at the upstream end 10a of the reactor. At 12 may be introduced, for example, ammonia, and at 13 a mixture of carrier gas, for example argon, and free hydrogen chloride. Argon and ammonia may also be mixed. The main thing is that the hydrogen chloride ammonia mixture is made at a temperature above 250° C. so as to avoid the precipitation of ammonium chloride.

The inlet tube 11 for gallium chloride the orifice 11a of which is near the reaction and deposition zone comprises a bulge 11b in which is placed a quantity 14 of liquid gallium.

Since the synthesis of gallium chloride is effected favourably at a temperature near that of gallium nitride, the said depressed portion 11b may be near the orifice 11a of the tube 11; on the other hand, the part of the tube 11c which, for convenience, is slipped on a sleeve 11d situated at the upstream extremity 10a of the reactor 10 which is at a lower temperature, is long enough.

Hydrogen chloride is admitted through the sleeve 11d; the supply of hydrogen chloride admitted through the sleeve 11d controls the partial pressure of gallium chloride since, as already indicated above, at least 80% of the hydrogen chloride admitted into the bubble where the gallium is present is transformed into gallium chloride.

It is obvious that the flow of the gas issued from the outlet 11a goes parallel to the flow of the atmosphere created upstream of the reactor.

The substrate support 15 is placed downstream of the orifice 11a, at 1 cm from same, and the level 11$a_1$ of the lower part of the said orifice is at the level of the substrate 1 or at a level which is a bit higher, for example 1 cm.

Once the substrate or substrates is or are provided in place, the reactor is swept with argon, introduced at 13, for approximately 5 minutes, then the furnace is heated to a suitable temperature under a carrier gas. Once the furnace has reached a suitable temperature, the ammonia inlet is opened at 12 and there is swept for 5 minutes with the mixture of the carrier gas and ammonia, the atmosphere of the reactor and its flow are then perfectly established. Free hydrogen chloride is then introduced at 13 into the carrier gas and after 1 to 2 minutes a mixture of hydrogen chloride and carrier gas is finally introduced at 11d.

During favourable and reproduceable experiments carried out by Applicants, in which the reactor 10 was a quartz tube of 40 mm diameter, the inlet tube 11 was also a quartz tube of 6 mm diameter and the temperature was between 900° and 950° C., the supplies used were 4 l/mn for the carrier gas (argon) introduced at 13, 4 l/min for ammonia introduced at 12, and 1 l/mn for free hydrogen chloride according to the invention introduced at 13 with the carrier gas, and 0.01 l/mn for hydrogen chloride introduced at 11d - to which a supply of 0.2 l/mn of carrier gas (argon) was added to ensure that the gallium chloride flow had a flow rate of the same order as the flow rate of the assembly of the atmosphere, this to avoid turbulences. The deposit is effected on the whole surface of the walls of the reactor in the reaction zone, on the substrate support 15 and on the substrate or substrates; the place favourable for the monocrystalline deposits has a width of 2.5 cm and a length of approximately 15 cm.

In the conditions described, the monocrystalline deposit is carried out at a rate of 2 μm/hour and the nucleation is always terminated after half an hour; thus depositing the nucleation layer 2 in FIG. 1.

In order to accelerate the deposit, the supply of gallium chloride is increased by increasing the supply of the hydrogen chloride in the sleeve 11d. For example, the supply may be brought from 0.01 to 0.2 l/mn while suppressing the admission of carrier gas in the sleeve 11d and without modifying any other supply.

In the conditions described the monocrystalline deposit is carried out at a rate of 80 μm/h, thus depositing the layer 3 in FIG. 1.

The reaction is interrupted by discontinuing the hydrogen chloride flow and then the ammonia flow when the layer 3 thus deposited has reached the desired thickness, for example 200 μm.

At the beginning of the heteronucleation the deposited gallium nitride may be doped with zinc vapours obtained by passing a carrier gas flow at a temperature between 300° and 800° C. (or preferably between 500° and 700° C.) on the zinc powder, for example, in a supplementary supply not shown in the Figures. Advantageously, the carrier gas supply is of the order of 1/120 of the overall supply of the gas traversing the reactor.

Applicants have thus obtained in a reproduceable manner semi-insulating gallium nitride having a resistivity between $10^5$ and $10^6$ Ohm.cm, of a high quality and producing notably excellent results in cathodoluminescence.

With zinc-doped GaN, electroluminescent diodes have been obtained the lights of which varied from orange to dark blue. The voltages to be applied are from 2.4 V for orange, 2.6 V for yellow, 2.8 V for green and 3.2 V for blue applied in the direct sense, the power efficiency being from $10^{-3}$ for green and blue.

The low value of the voltage necessary to obtain the light constitutes an advantage since previously the voltages used had to be 10 to 20 V. The reason for these advantageous values resides in the fineness and the quality of the layers which can be permitted by the method according to the present invention.

What is claimed is:

1. A method of manufacturing single crystals consisting essentially of gallium nitride comprising introducing gallium chloride and ammonia into an upstream portion of an open elongated reactor causing said gallium chloride and ammonia to react, said gallium chloride being produced in the reactor by the action of a first supply of hydrogen chloride on a quantity of liquid gallium contained in a bulge in said reactor, in the vapor phase while in the presence of a carrier gas depositing the resultant gallium nitride on a substrate located in the reactor downstream from the point of introduction of said gallium chloride said ammonia and most of the carrier gas being introduced into a first upstream end of said reactor thereby creating an ammonia containing atmosphere which flows from said upstream end to a second downstream end of said reactor removing residual gases from the proximity of said downstream end, directing said gallium chloride produced to flow in said reactor in a direction parallel to the flow of said ammonia containing atmosphere along a route to the deposition zone separate from that of the ammonia containing atmosphere and the rate of flow of said gallium chloride containing stream is between half and five times the rate of flow of said ammonia containing atmosphere, while introducing into said reactor a second supply of free hydrogen chloride in an amount such that the partial pressure of said hydrogen chloride in the reaction and deposition zones in said reactor is from 2 to 50% of the total pressure in said reactor, said carrier gas being free of hydrogen, the total pressure within the reactor being about the order of atmospheric pressure, the partial pressure of the ammonia being more than 0.150 atmospheres, the partial pressure of the gallium chloride being less than 0.05 atmospheres, the partial pressure of the hydrogen chloride being between 0.02 and 0.4 atmospheres and the temperatures in the reaction and deposition zones being from 720° C. to 1100° C.

2. A method as claimed in claim 1, characterized in that the gallium chloride partial pressure is lower than 5 hundredths of the overall pressure, while the partial pressure of ammonia is higher than 15 hundredths of the said overall pressure.

3. A method as claimed in claim 1, characterized in that the partial pressure of ammonia is between 0.3 and 0.6 atmosphere, the partial pressure of hydrochloric acid is between 0.05 and 0.2 atmosphere and the said temperature is between 900° C. and 950° C.

4. A method of claim 3, characterized in that the carrier gas is an inert gas.

5. A method as claimed in claim 4, characterized in that the inert gas is mainly argon.

6. A method as claimed in claim 4, characterized in that the carrier gas is mainly nitrogen.

7. A method of claim 3, characterized in that the carrier gas is ammonia.

8. A method of claim 1 wherein a heteronucleation layer of said gallium nitride is deposited on a suitable substrate and wherein the partial pressure of the gallium chloride is less than five thousands of the total pressure, and the partial pressure of the ammonia is more than a tenth of the total pressure.

9. A method as claimed in claim 8, characterized in that the nucleation layer is given a thickness exceeding 0.5 μm.

10. A method as claimed in claim 8, characterized in that the nucleation layer is given a thickness exceeding 1 μm.

11. A method as claimed in claim 8, characterized in that the substrate is a hexagonal lattice of which the mesh has a length side between 2.70 and 3.66 Å.

12. A method as claimed in claim 11, characterized in that the said substrate is corundum.

13. The method of claim 8 wherein the partial pressure of the gallium chloride is less than two one thousands of the total pressure, the partial pressure of the ammonia is more than fifteen one hundreds of the total pressure and the partial pressure of hydrochloric acid is between 50 to 120 times the pressure of the gallium chloride.

14. A method of claim 13 wherein the temperatures in the reaction zone and in the deposition zone is between 850° C. and 1100° C.

15. A method of claim 14 wherein the partial pressure of ammonia is more than 0.20 atmospheres.

16. A method of claim 15 wherein the partial pressure of the hydrogen chloride is between 0.05 and 0.2 atmosphere.

17. A method of claim 16 wherein the temperature of the reaction zone and the deposition zones is between 900° C. and 950° C.

18. A method of claim 8 wherein after deposition of the heteronucleation layer the crystal growth is continued by increasing the gallium chloride partial pressure to a value of up to but less than five one hundreds of the total pressure in the reactor.

19. A method as claimed in claim 1, characterized in that a flow of hydrochloric acid is introduced upstream of the reactor in a zone where the temperature is higher than the temperature of the formation of ammonium chloride at the pressure considered.

20. A method of claim 1 wherein the rate of flow of the gallium chloride containing atmosphere is from one to two times that of the ammonia containing atmosphere.

21. A method of claim 1 wherein the outlet of the route through which said gallium chloride containing atmosphere is introduced is situated in the flow of said ammonia containing atmosphere at a point upstream of said substrate.

22. A method of claim 21 wherein said outlet is situated substantially at the level of the upstream end of said substrate.

23. The method of claim 21 wherein the carrier gas is added to the flow of the gallium chloride containing atmosphere.

24. The method of claim 23 wherein the supply of carrier gas to the gallium chloride containing atmosphere is variable.

25. The method of claim 24 wherein the rate of flow of the gallium chloride containing atmosphere is controlled by controlling the rate of addition of the supply of the carrier gas to the gallium chloride containing atmosphere.

26. A method of claim 1 wherein a supply of atoms, other than gallium and nitrogen, which can be integrated into the crystal lattice is introduced into the upstream end of the reactor.

27. A method of claim 1 wherein a supply of atoms, other than gallium and nitrogen, which can be integrated into the crystal lattice is introduced into the flow of the gallium chloride containing atmosphere.

28. The method of claim 1 wherein an indium halide is introduced into said reaction and deposition zones.

29. The method of claim 1 wherein an aluminum halide is introduced into the reaction and deposition zones.

30. The method of claim 1 wherein the halide of a doping element is introduced into the reactor.

31. The method of claim 30 wherein said halide is a chloride.

32. The method of claim 1 wherein a doping element is introduced into the reactor in the form of a metal vapor.

33. A method as claimed in claim 32, characterized in that the said doping element is magnesium.

34. A method as claimed in claim 32, characterized in that the said doping element is cadmium.

35. A method as claimed in claim 32, characterized in that said doping element is zinc.

36. A method as claimed in claim 35, characterized in that zinc is brought in the reactor in the form of vapours obtained by causing a flow of carrier gas to pass, at a temperature between 300 and 800° C., on the zinc powder, the supply of the said carrier gas being of the order of 1/20 of the overall supply of gas traversing the said reactor.

37. A method as claimed in claim 36, characterized in that the temperature of the carrier gas is between 500 and 700° C.

38. A method of claim 1 wherein the crystals produced are reheated at a temperature of from 600° C.–1000° C. in a hydrogen free atmosphere.

39. A method as claimed in claim 1, characterized in that the said second HCl containing atmosphere is supplied separately until in the reaction and deposition zone.

40. A method as claimed in claim 1, characterized in that the said free HCl is joined to the gallium chloride flow already formed and in that said two gases arrive together in the reaction and deposition zone.

41. A method as claimed in claim 1, characterized in that the said free HCl is joined to the ammonia flow, the temperature of the mixture being always higher than 250° C.

42. A method as claimed in claim 1, characterized in that the said free HCl is joined to the carrier gas, the temperature of the mixture with the ammonia flow being higher than 250° C.

* * * * *

UNITED STATES PATENT AND TRADEMARK OFFICE
CERTIFICATE OF CORRECTION

PATENT NO. : 4,144,116
DATED : March 13, 1979
INVENTOR(S) : GUY MICHEL JACOB ET AL It is certified that error appears in the above-identified patent and that said Letters Patent are hereby corrected as shown below:

Claim 1, line 54, delete "causing said gallium chlo-"
lines 55, 56 and 57, delete the lines in their entirety
line 58, delete "tained in a bulge in said reactor," and insert --, said gallium chloride being produced in the reactor by the action of a first supply of hydrogen chloride on a quantity of liquid gallium contained in a bulge in said reactor, causing said gallium chloride and ammonia to react--

Signed and Sealed this

Eighteenth Day of March 1980

[SEAL]

Attest:

SIDNEY A. DIAMOND

Attesting Officer

Commissioner of Patents and Trademarks